United States Patent
Nakaoka et al.

(10) Patent No.: US 9,263,989 B2
(45) Date of Patent: Feb. 16, 2016

(54) DIFFERENTIAL OSCILLATOR

(71) Applicant: NIHON DEMPA KOGYO CO., LTD., Tokyo (JP)

(72) Inventors: Takashi Nakaoka, Saitama (JP); Hiroshi Hoshigami, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/315,295

(22) Filed: Jun. 25, 2014

(65) Prior Publication Data
US 2015/0028958 A1    Jan. 29, 2015

(30) Foreign Application Priority Data

Jul. 29, 2013 (JP) ................................. 2013-156248

(51) Int. Cl.
*H03B 5/36* (2006.01)

(52) U.S. Cl.
CPC ..................................... *H03B 5/368* (2013.01)

(58) Field of Classification Search
CPC ....................................................... H03B 5/368
USPC ............................ 331/158, 117 R, 167, 177 V
See application file for complete search history.

(56) References Cited

U.S. PATENT DOCUMENTS

| 7,002,423 | B1* | 2/2006 | Drakhlis et al. | 331/158 |
| 2004/0113707 | A1* | 6/2004 | Fredriksson | 331/135 |
| 2006/0049884 | A1* | 3/2006 | Kollmann | 331/158 |

FOREIGN PATENT DOCUMENTS

| JP | 2007-110701 | 4/2007 |
| JP | 2008-017449 | 1/2008 |

\* cited by examiner

*Primary Examiner* — Joseph Chang
(74) *Attorney, Agent, or Firm* — Jianq Chyun IP Office

(57) ABSTRACT

A differential oscillator includes a resonator, a differential amplifier circuit, and a filter. The filter is disposed in parallel to the resonator and the differential amplifier circuit. The filter has a first resonance frequency in the first resonance mode and a second resonance frequency in the second resonance mode. The filter has a lower impedance at one frequency in one of the first resonance frequency and the second resonance frequency than an impedance at one frequency at another in the first resonance frequency and the second resonance frequency. The differential oscillator has a negative resistance at a frequency at which the impedance of the filter is higher while the differential oscillator does not have a negative resistance at a frequency at which the impedance of the filter is lower among the first resonance frequency and the second resonance frequency.

6 Claims, 6 Drawing Sheets

DIFFERENTIAL OSCILLATOR

CROSS REFERENCE TO RELATED APPLICATIONS

This application claims the priority benefit of Japan application serial no. 2013-156248, filed on Jul. 29, 2013. The entirety of the above-mentioned patent application is hereby incorporated by reference herein and made a part of this specification.

TECHNICAL FIELD

This disclosure relates to a differential oscillator.

DESCRIPTION OF THE RELATED ART

Conventionally, there is known a differential oscillator where a differential amplifier circuit that is constituted of a plurality of amplifier circuits oscillates a resonator (for example, see Japanese Unexamined Patent Application Publication Nos. 2007-110701 and 2008-17449).

The differential amplifier circuit has a negative resistance that is larger than a negative resistance of a colpitts oscillator circuit. Thus, in the case where a resonator has a plurality of resonance modes, the differential amplifier circuit is able to easily oscillate the resonator even at a resonance mode with a comparatively large resistance, compared with the colpitts oscillator circuit. However, in the case where the resonator has a plurality of resonance modes with mutually close frequencies, there is a risk to cause an unnecessary oscillation at a frequency other than a desired frequency.

FIG. 7 is a graph illustrating a negative resistance characteristic (a solid line) of a conventional differential oscillator and an impedance characteristic of a resonator (a dashed line). The horizontal axis indicates frequency, while the vertical axis indicates an impedance or a negative resistance. The resonator illustrated in FIG. 7 has three resonance modes of "a", "b", and "c." Among the three resonance modes, since the differential oscillator has a positive resistance value and does not have a negative resistance at a resonance frequency of the resonance modes "a", the differential oscillator does not oscillate.

However, the differential oscillator has a negative resistance value at each of the resonance mode "b" and the resonance mode "c," the differential oscillator may oscillate at any of the resonance modes "b" and "c." Therefore, if the differential oscillator is attempted to oscillate at one of the resonance modes "b" and "c," there is a problem to cause a differential oscillator to make an unnecessary oscillation.

A need thus exists for a differential oscillator which is not susceptible to the drawback mentioned above.

SUMMARY

A differential oscillator according to the disclosure includes a resonator, a differential amplifier circuit, and a filter. The resonator has at least a first resonance mode and a second resonance mode. The differential amplifier circuit is configured to oscillate the resonator. The filter is disposed in parallel to the resonator and the differential amplifier circuit. The filter has a first resonance frequency in the first resonance mode and a second resonance frequency in the second resonance mode. The filter has a lower impedance at one frequency in one of the first resonance frequency and the second resonance frequency than an impedance at one frequency at another in the first resonance frequency and the second resonance frequency. The differential oscillator has a negative resistance at a frequency at which the impedance of the filter is higher while the differential oscillator does not have a negative resistance at a frequency at which the impedance of the filter is lower among the first resonance frequency and the second resonance frequency.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

First Embodiment

Figure 1:
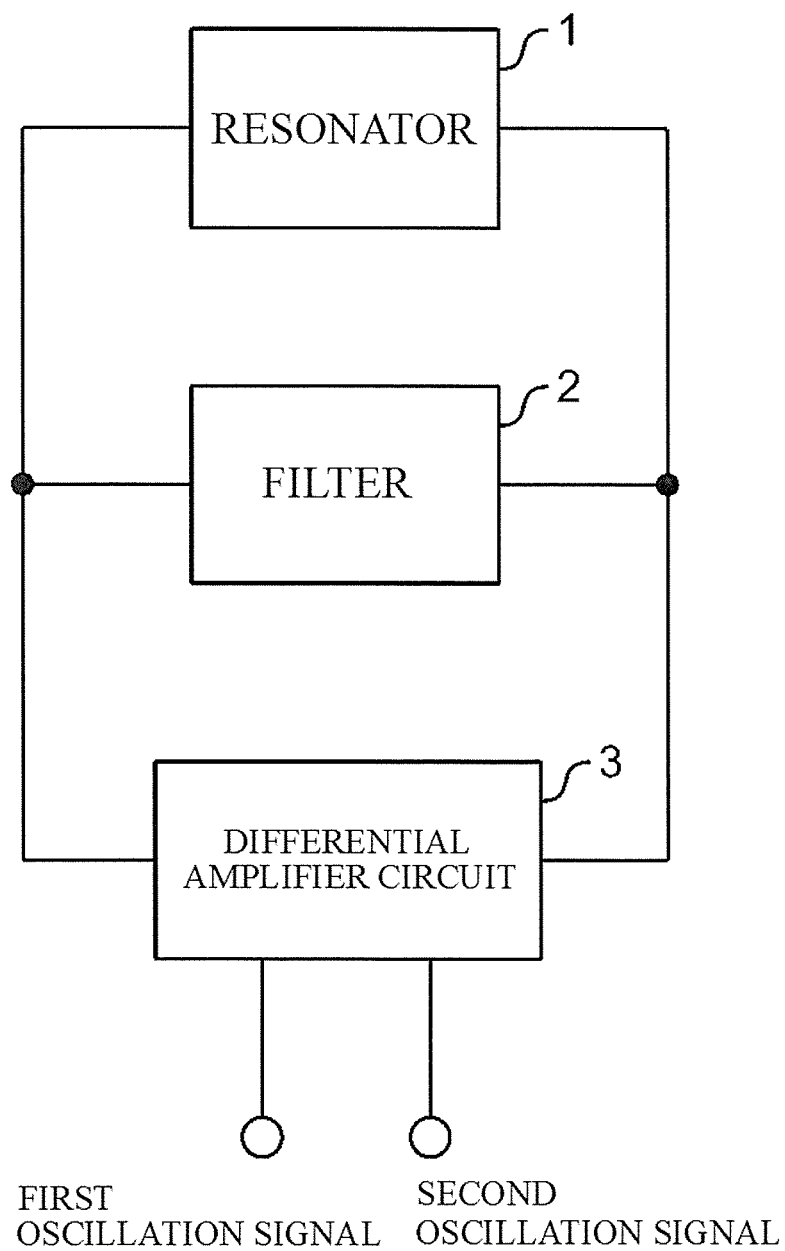
FIG. 1 is a diagram illustrating a schematic configuration of a differential oscillator according to a first embodiment.

FIG. 1 illustrates a schematic configuration of a differential oscillator 100 according to a first embodiment. The differential oscillator 100 includes a resonator 1, a filter 2, and a differential amplifier circuit 3. The resonator 1, the filter 2, and the differential amplifier circuit 3 are connected to one another in parallel.

The resonator 1 is, for example, a crystal unit and has a plurality of resonance modes. The resonator 1 has at least first and second resonance modes, each of which has different resonance frequency from one another. A first resonance mode is, for example, Mode C, and a second resonance mode is, for example, Mode B.

The filter 2 is connected in parallel to the resonator 1 and the differential amplifier circuit 3 that oscillates the resonator 1. The impedance at either the first resonance frequency of the first resonance mode or the second resonance frequency of the second resonance mode is lower than the impedance at the other frequency. For example, when the impedance at the first resonance frequency is lower than an impedance at the second resonance frequency, the filter 2 absorbs the oscillation energy generated by the differential amplifier circuit 3 at near the first resonance frequency. Consequently, since the negative resistance of the differential oscillator 100 disappears at near the first resonance frequency, the differential oscillator 100 does not oscillate at the first resonance frequency. On the other hand, since the negative resistance of the differential oscillator 100 appears at near the second resonance frequency, the differential oscillator 100 oscillates at the second resonance frequency.

Similarly, when the impedance at the second resonance frequency is lower than an impedance at the first resonance frequency, the filter 2 absorbs the oscillation energy generated by the differential amplifier circuit 3 at near the second resonance frequency. Consequently, since the negative resistance of the differential oscillator 100 disappears at near the second resonance frequency, the differential oscillator 100 does not oscillate at the second resonance frequency but oscillates at the first resonance frequency.

The differential amplifier circuit 3 includes a plurality of amplifier circuits. The differential amplifier circuit 3 outputs multiple signals whose phases are reversed one another that are amplified by the multiple amplifier circuits connected to a common power source.

Figure 2:
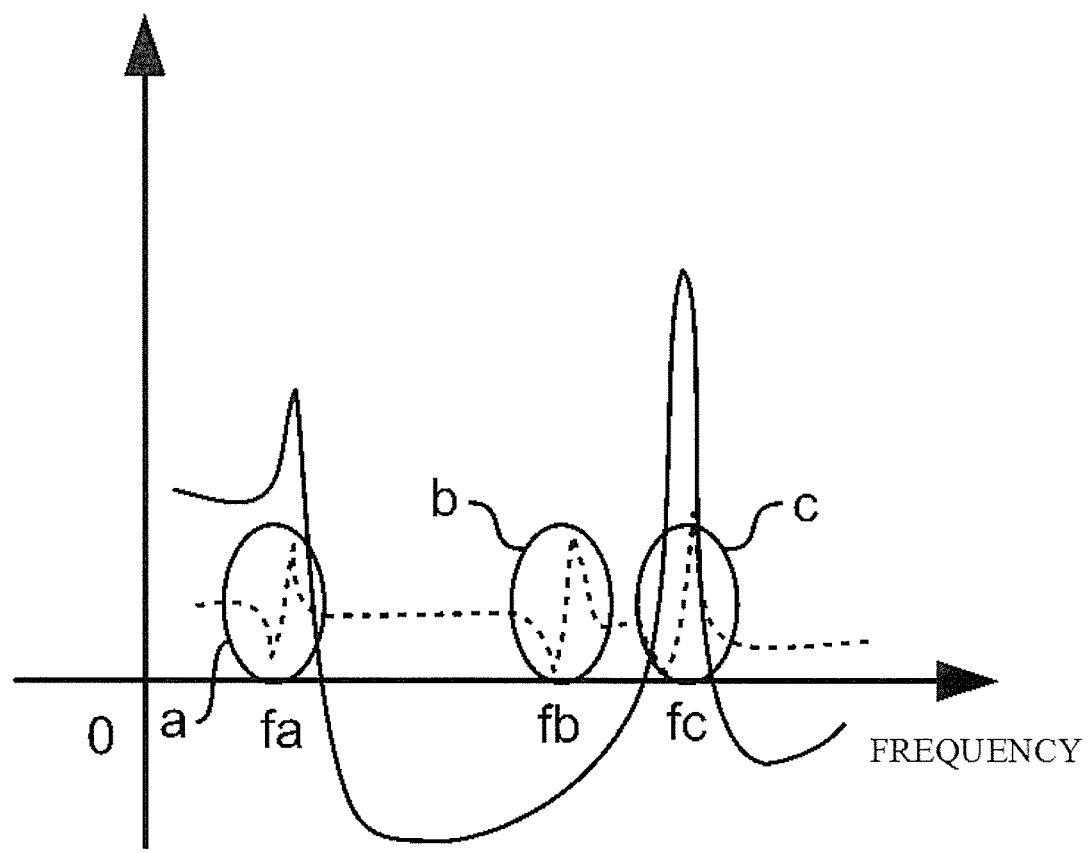
FIG. 2 is a diagram illustrating a negative resistance characteristic (a solid line) of a differential oscillator and an impedance characteristic (a dashed line) of a resonator.

FIG. 2 is a diagram illustrating a negative resistance characteristic (a solid line) of the differential oscillator and an impedance characteristic (a dashed line) of a resonator. For the differential oscillator 100 whose characteristics are illustrated in FIG. 2, the resonance frequency of the filter 2 is approximately equal to the resonance frequency fc in the resonance mode c, and the impedance of the filter 2 at the resonance frequency fc in the resonance mode c is lower than the impedance at the resonance frequency fb in the resonance mode b. Consequently, since the differential oscillator 100 exhibits no negative resistance at the resonance frequency fc and exhibits a negative resistance at the resonance frequency fb, the differential oscillator 100 does not perform unnecessary oscillation at the resonance frequency fc and stably oscillates at the resonance frequency fb.

Furthermore, the cutoff frequency of the negative resistance in FIG. 2 is higher than the resonance frequency fa in the resonance mode a, and the differential oscillator 100 does not have a negative resistance at the resonance frequency fa. Consequently, among the three resonance modes, the differential oscillator 100 has a sufficient negative resistance for oscillation only at the resonance frequency fb in the resonance mode b, thus the differential oscillator 100 can oscillate at a desired oscillation frequency.

Figure 3:
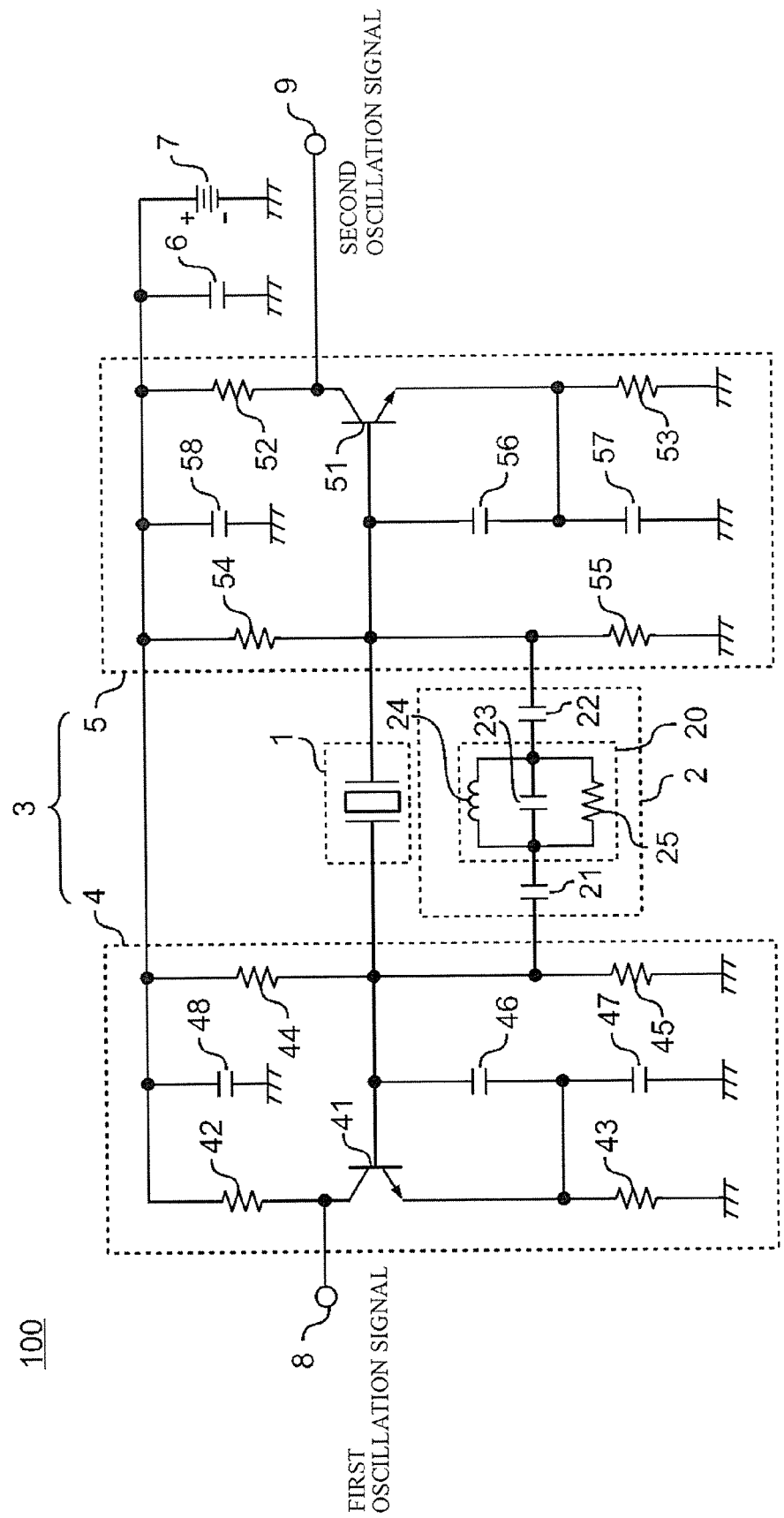
FIG. 3 is a diagram illustrating a detailed exemplary configuration of a differential oscillator.

FIG. 3 is a diagram illustrating a detailed exemplary configuration of the differential oscillator 100. The filter 2 includes a parallel resonance circuit 20 in which a capacitor 23, an inductor 24, and a resistor 25 are connected with each other in parallel, a capacitor 21 and a capacitor 22 that are connected to the parallel resonance circuit 20 in series. The capacitor 21 is disposed between one end of the parallel resonance circuit 20 and one end of the resonator 1. The capacitor 22 is disposed between the other end of the parallel resonance circuit 20 and the other end of the resonator 1. Namely, the capacitor 21 and the capacitor 22 are connected to respective ends of the parallel resonance circuit 20, which serves as a tank circuit.

The capacitor 21 has a capacitance value nearly equal to a capacitance of the capacitor 22. The reactances of the capacitor 21 and the capacitor 22 at a frequency where the differential oscillator 100 has a negative resistance are large to the extent that the reactance does not practically affect the Q-value of the resonator 1. For example, the reactances of the capacitor 21 and the capacitor 22 at the frequency are higher than a reactance of the capacitor 23.

The differential amplifier circuit 3 includes an amplifier circuit 4 and an amplifier circuit 5, which contain an equivalent circuit, a bypass capacitor 6, and a power source 7. The amplifier circuit 4 includes a transistor 41, a resistor 42, a resistor 43, a resistor 44, a resistor 45, a capacitor 46, a capacitor 47, and a capacitor 48. The transistor 41 has a base connected to one end of the resonator 1 and the capacitor 21, a collector connected to the power source via the resistor 42, and an emitter connected to ground via the resistor 43. The transistor 41 has a collector connected to an output terminal 8 that outputs a first oscillation signal.

The resistor 44 and the resistor 45 serve as a bias resistance of the transistor 41. The resistor 44 has one end connected to the power source, and the other end connected to the base of the transistor 41, the resistor 45, and one end of the resonator 1. The capacitor 46 is disposed between the base of the transistor 41 and the emitter. The capacitor 47 is disposed between the emitter of the transistor 41 and ground. The capacitor 48 is a bypass capacitor that is disposed between the power source and ground.

Similarly, the amplifier circuit 5 includes a transistor 51, a resistor 52, a resistor 53, a resistor 54, a resistor 55, a capacitor 56, a capacitor 57, and a capacitor 58. The transistor 51 has a base connected to one end of the resonator 1 and the capacitor 22, a collector connected to the power source via the resistor 52, and an emitter connected to ground via the resistor 53. The collector of the transistor 51 is connected to an output terminal 9 that outputs a second oscillation signal whose phase is 180° apart from the phase of the first oscillation signal.

The resistor 54 and the resistor 55 serve as a bias resistance of the transistor 51. The resistor 54 has one end connected to the power source, and the other end connected to the base of the transistor 51, the resistor 55, and one end of the resonator 1. The capacitor 56 is disposed between the base of the transistor 51 and the emitter. The capacitor 57 is disposed between the emitter of the transistor 51 and ground. The capacitor 58 is a bypass capacitor that is disposed between the power source and ground.

With the above-described configuration, the impedance characteristic of the filter 2 is determined by the capacitance value of the capacitor 23 and the inductance value of the inductor 24, and the differential oscillator 100 oscillates at the resonance frequency of one resonance mode corresponding to the impedance characteristic when the resonator 1 has a plurality of resonance modes.

Figure 4:
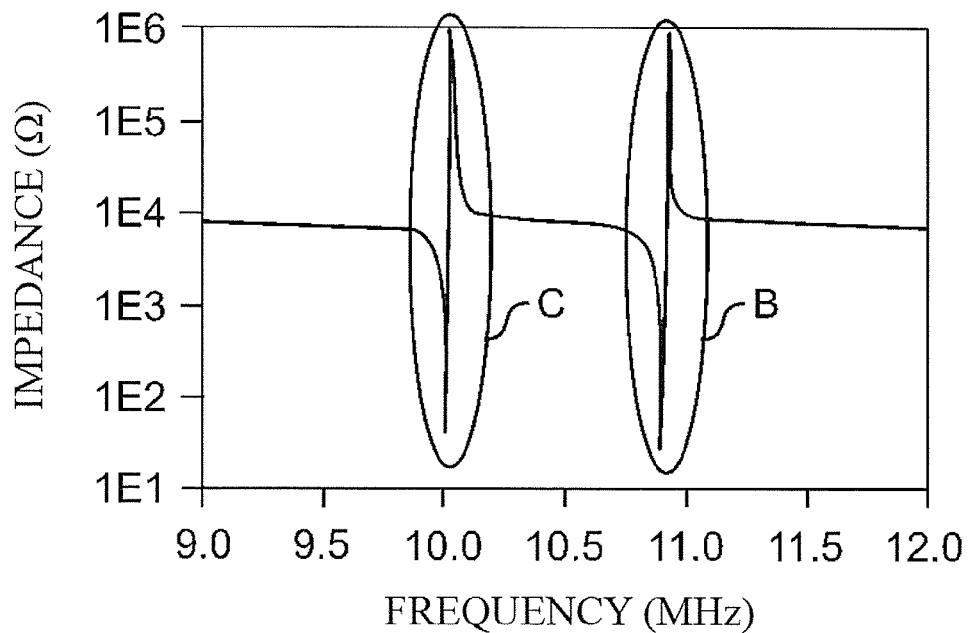
FIG. 4 is a diagram illustrating an exemplary frequency characteristic of an impedance of a resonator.
Figure 5:
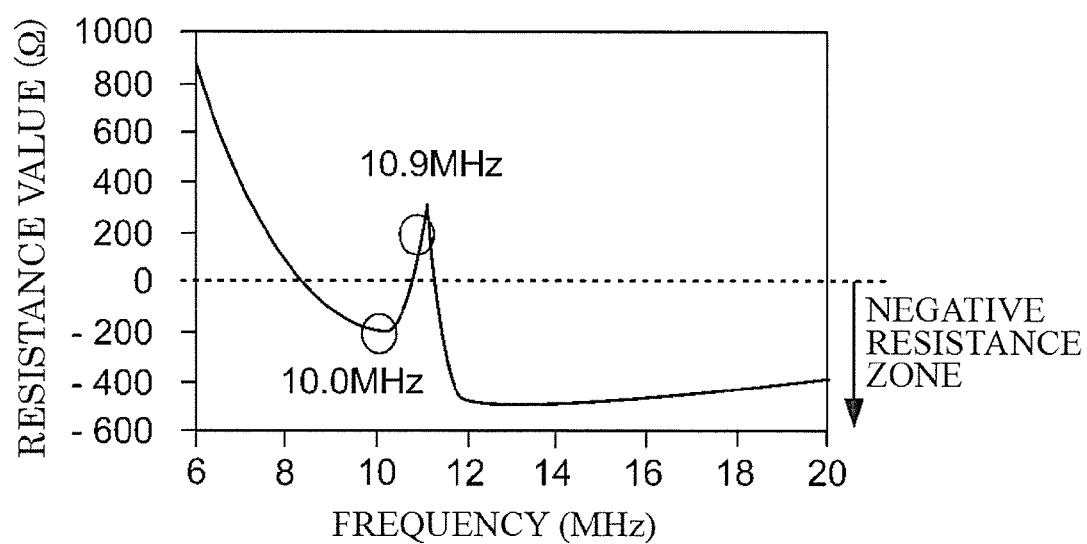
FIG. 5 is a diagram illustrating an exemplary frequency characteristic of a negative resistance of a differential oscillator.

FIG. 4 is a diagram illustrating an exemplary frequency characteristic of the impedance of the resonator 1. FIG. 5 is a diagram illustrating an exemplary frequency characteristic of the negative resistance of the differential oscillator 100. For the example illustrated in FIG. 4, the resonator 1 has a main vibration mode whose resonance frequency is 10.0 MHz and a sub-vibration mode whose resonance frequency is 10.9 MHz.

For the example illustrated in FIG. 5, the negative resistance is about 200Ω at 10.0 MHz, which is the resonance frequency of the main vibration mode, while the resistance value is about 200Ω at 10.9 MHz, the resonance frequency of the sub-vibration mode, and no negative resistance exists. Consequently, for the examples illustrated in FIG. 4 and FIG. 5, the differential oscillator 100 oscillates at 10.0 MHz, which is the resonance frequency of the main vibration mode, and can prevent an undesired oscillation at 10.9 MHz, which is the resonance frequency of the sub-vibration mode.

As described above, in the differential oscillator 100 according to this embodiment, since the filter 2 is connected to the resonator 1 and the differential amplifier circuit 3 in parallel, the differential oscillator 100 has a negative resistance at a frequency where the impedance of the filter 2 is higher and has no negative resistance at a frequency where the impedance of the filter 2 is lower. Consequently, the differential oscillator 100 oscillates at a desired frequency that is determined by the impedance characteristic of the filter 2 and prevents oscillation at a frequency other than the desired frequency.

Second Embodiment

Figure 6:
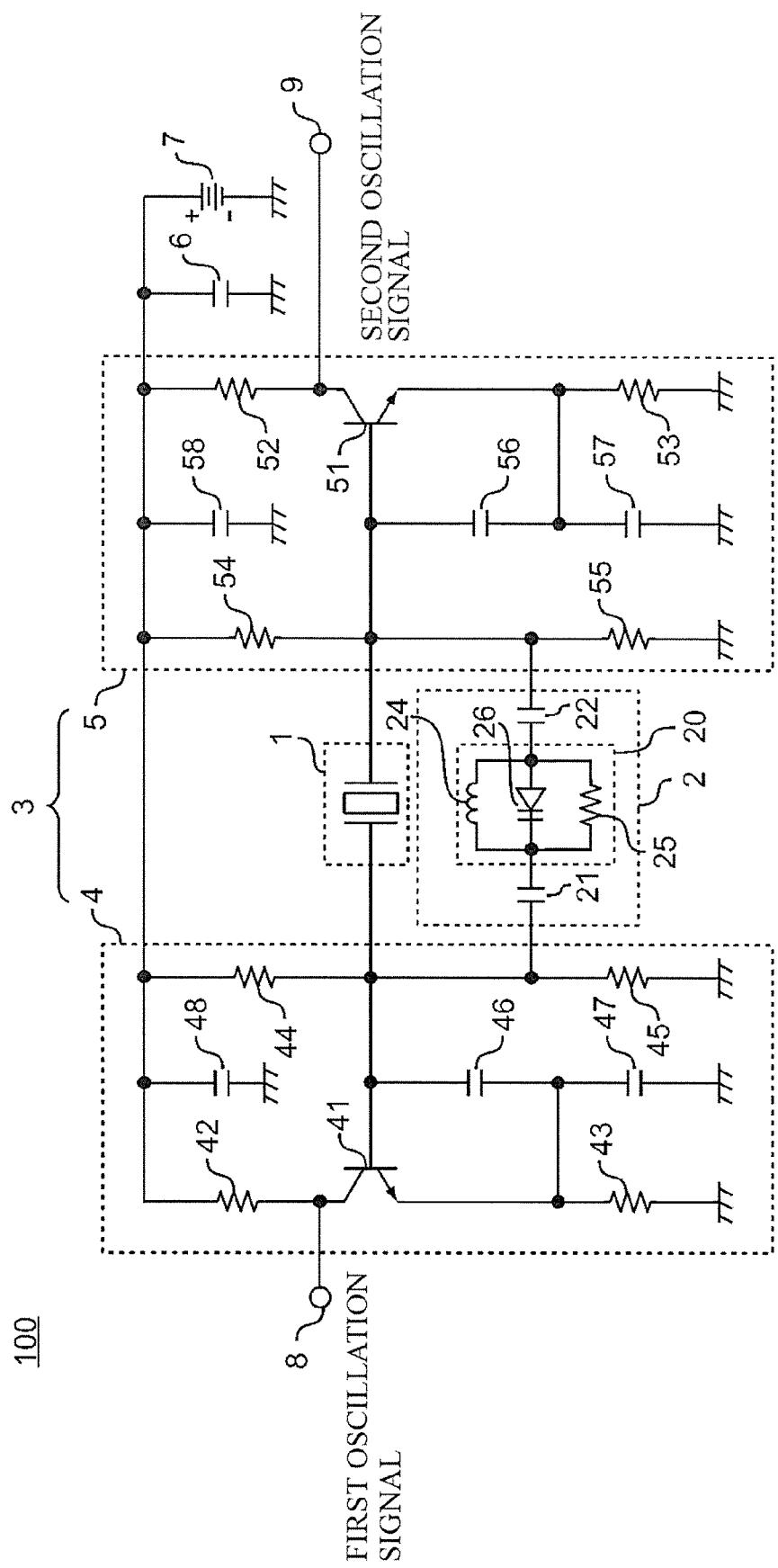
FIG. 6 is a diagram illustrating a detailed exemplary configuration of a differential oscillator according to a second embodiment.
Figure 7:
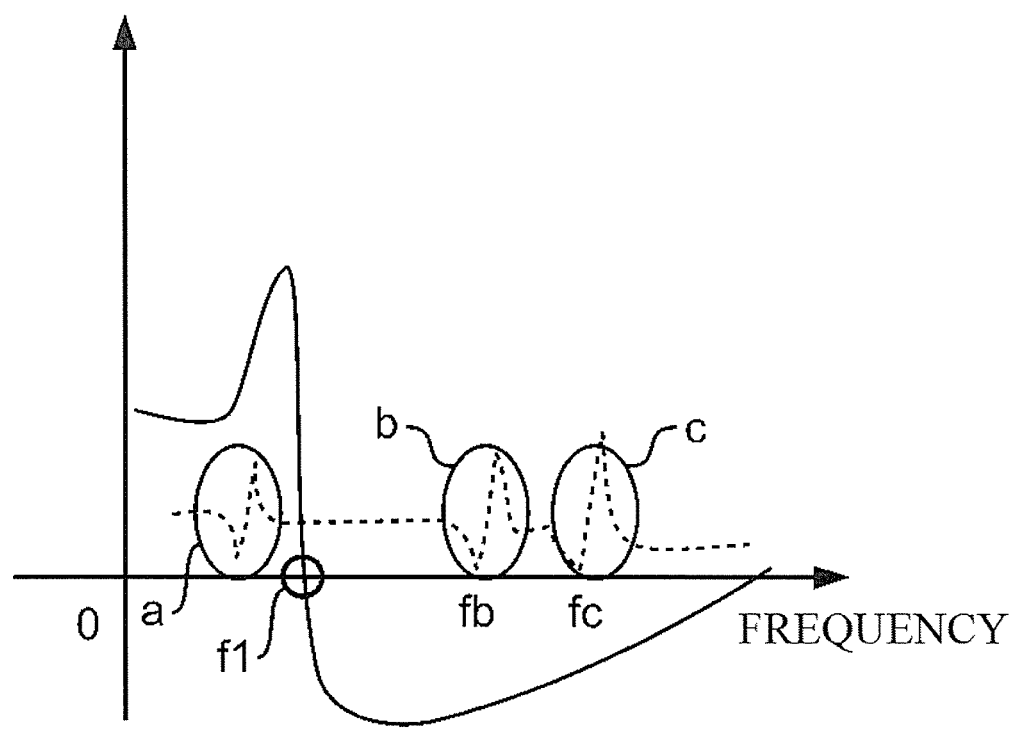
FIG. 7 is a diagram illustrating a negative resistance characteristic (a solid line) of a conventional differential oscillator and an impedance characteristic (a dashed line) of a resonator.

FIG. 6 is a diagram illustrating a detailed exemplary configuration of the differential oscillator according to a second embodiment. The filter 2 according to the first embodiment can change the resonance frequency with a constant of either the capacitor 23 or inductor 24, but cannot change the resonance frequency after the capacitor 23 and inductor 24 are mounted. The filter 2 according to this embodiment can change the resonance frequency even after the capacitor 23 and inductor 24 are mounted. Consequently, the differential oscillator 100 according to this embodiment can switch a frequency at which the differential oscillator 100 oscillates by control from outside. At this point, the differential oscillator 100 according to this embodiment is different from the differential oscillator 100 according to the first embodiment, otherwise they are same.

Specifically, the filter 2 according to this embodiment includes a variable capacitance element 26 whose electrostatic capacity value changes corresponding to a control voltage applied from outside instead of the capacitor 23. The impedance characteristic of the filter 2 varies corresponding to the control voltage. The variable capacitance element 26 is, for example, a varicap diode, and its electrostatic capacity value is inversely proportional to the square root of a voltage applied between capacity terminals.

The higher the electrostatic capacity value of the variable capacitance element 26 becomes, the lower the resonance frequency of the filter 2 becomes. The lower the electrostatic capacity value of the variable capacitance element 26 becomes, the higher the resonance frequency of the filter 2 becomes. Consequently, increasing the voltage applied between both the ends of the variable capacitance element 26 allows the resonance frequency of the filter 2 to become higher, and decreasing the voltage applied between both the ends of the variable capacitance element 26 allows the resonance frequency of the filter 2 to become lower.

As described above, with the differential oscillator 100 according to this embodiment, since the filter 2 includes the variable capacitance element 26, the resonance mode in which the differential oscillator 100 oscillates can be switched by controlling the voltage applied from outside.

While in the present disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

For example, with the above-described embodiments, while the description is given assuming that the transistor 41 and the transistor 51 are junction transistors, the transistor 41 and the transistor 51 may be electric field effect transistors. Also, with the above-described embodiments, while the description is given assuming that the resonator 1 is a crystal unit, the resonator 1 may be another resonator such as a ceramic resonator and a Micro Electro Mechanical Systems (MEMS) resonator. Furthermore, with the above embodiments, while the configuration is described where the filter 2 includes both the capacitor 21 and the capacitor 22, the filter 2 may have only one of either the capacitor 21 or the capacitor 22.

The above-described filter may include, for example, a parallel resonance circuit, a first capacitor disposed between one end of the parallel resonance circuit and one end of the resonator, and a second capacitor disposed between another end of the parallel resonance circuit and another end of the resonator.

The above-described parallel resonance circuit may include an inductor, a third capacitor, and a resistor that are connected in parallel to one another. The first capacitor and the second capacitor may have respective reactances larger than a reactance of the third capacitor at a frequency at which the differential oscillator has the negative resistance.

The filter may include a variable capacitance element, and an impedance characteristic of the filter changes corresponding to a control voltage to be applied to the variable capacitance element.

With the embodiments of this disclosure, it is possible to oscillate a resonator having a plurality of resonance modes at a desired frequency.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A differential oscillator, comprising:
    a resonator that has at least a first resonance mode and a second resonance mode;
    a differential amplifier circuit configured to oscillate the resonator;
    a filter disposed in parallel to the resonator and the differential amplifier circuit, the filter having a first resonance frequency in the first resonance mode and a second resonance frequency in the second resonance mode, a first impedance of the filter at one of the first resonance frequency and the second resonance frequency is lower than a second impedance of the filter at another one of the first resonance frequency and the second resonance frequency, wherein
    the differential oscillator has a negative resistance at a frequency at which the second impedance of the filter is higher while the differential oscillator does not have a negative resistance at a frequency at which the first impedance of the filter is lower, among the first resonance frequency and the second resonance frequency.

2. The differential oscillator according to claim 1, wherein the filter includes:
    a parallel resonance circuit;
    a first capacitor disposed between one end of the parallel resonance circuit and one end of the resonator; and
    a second capacitor disposed between another end of the parallel resonance circuit and another end of the resonator.

3. The differential oscillator according to claim 2, wherein the parallel resonance circuit includes an inductor, a third capacitor, and a resistor that are connected in parallel to one another,
    the first capacitor and the second capacitor have respective reactances larger than a reactance of the third capacitor at a frequency at which the differential oscillator has the negative resistance.

4. The differential oscillator according to claim 1, wherein the filter includes a variable capacitance element, and an impedance characteristic of the filter changes corresponding to a control voltage to be applied to the variable capacitance element.

5. The differential oscillator according to claim 2, wherein the filter includes a variable capacitance element, and an impedance characteristic of the filter changes corresponding to a control voltage to be applied to the variable capacitance element.

6. The differential oscillator according to claim 3, wherein the filter includes a variable capacitance element, and an impedance characteristic of the filter changes corresponding to a control voltage to be applied to the variable capacitance element.

* * * * *